United States Patent [19]

Needham

[11] Patent Number: 4,685,019

[45] Date of Patent: Aug. 4, 1987

[54] CONTROLLED ELECTRICAL CONTACTS FOR ELECTRICAL SWITCHGEAR

[75] Inventor: Eric Needham, Cumberland, R.I.

[73] Assignee: Engelhard Corporation, Menlo Park, N.J.

[21] Appl. No.: 727,991

[22] Filed: Apr. 29, 1985

[51] Int. Cl.[4] ............................................ H02H 3/033
[52] U.S. Cl. ......................................... 361/2; 361/8; 200/144 R; 200/144 AP
[58] Field of Search ..................... 361/2, 3, 8, 4, 5, 11, 361/12, 13, 6, 7, 9, 10, 58; 200/144 R, 144 AP; 307/305

[56] References Cited

U.S. PATENT DOCUMENTS

| | | | |
|---|---|---|---|
| 3,122,659 | 2/1964 | Krestel et al. | 361/9 X |
| 3,475,574 | 10/1969 | Stolarz | 200/144 AP |
| 3,491,284 | 1/1970 | Pascente | 361/3 X |
| 3,614,464 | 10/1971 | Chumakov et al. | 361/8 |
| 3,784,886 | 1/1974 | Miyata et al. | 307/305 X |
| 4,438,472 | 3/1984 | Woodwarth | 361/2 X |
| 4,525,762 | 6/1985 | Norris | 361/8 X |

Primary Examiner—A. D. Pellinen
Assistant Examiner—Anthony J. Wysocki

[57] ABSTRACT

Most contacts that are used in electrical switchgear are prone to erosion due to electrical arcs that are developed at the make and break of a circuit. Arcing is one of the major problems that can cause catastrophic failure of switchgear. In accordance with the invention, a discreet, controlled semiconductor switching assembly is provided within the conventional contact structure to reduce arcing. The semiconductor switching assembly includes a voltage-controlled gate that permits current flow through the contact only when desired. Current is allowed to flow only when the contact gap has been completely closed and is prevented from flowing immediately before the contacts are opened. Thus, there is very little current available to form an arc plasma, and, therefore, erosion of the contact surface is minimal, being mostly the product of mechanical wear.

40 Claims, 11 Drawing Figures

CONTROLLED ELECTRICAL CONTACTS FOR ELECTRICAL SWITCHGEAR

BACKGROUND OF THE INVENTION

This invention relates to electrical contact switches ordinarily prone to failure due to erosion that develops as a result of the occurrence of electrical arcs between the respective surfaces of the contacts. More particularly, this invention relates to electrical contact switches provided with protection against such erosion.

Most contacts that are used in electrical switchgear are prone to erosion due to electrical arcs that are developed at the make and break of a circuit. Arcing is one of the major problems that can cause catastrophic failure of switchgear.

Many attempts have been made to reduce or eliminate the arcing and hence the erosion. For example, U.S. Pats. Nos. 4,345,130 and 3,154,660 disclose controlling of arc erosion of the contact surface through the use of specific materials to form the contact. In U.S. Pat. No. 4,345,130, an interrupting layer of Cu-W alloy is bonded to a base plate of an electro-conductive material, and a contacting layer of Ag-WC alloy is bonded to the Cu-W layer. The Ag-WC alloy layer is said to provide a low and stable contact resistance, while the Cu-W alloy layer is said to provide arc erosion resistivity and anti-weld capability. In U.S. Pat. No. 3,154,660, a copper-cadmium layer formed on a copper contact is said to limit the effects of arc erosion. Such approaches, however, require the use of specific alloy materials to control arc erosion.

Arc extinguishing elements to control arc currents that may develop between the contact surfaces of breaker elements are disclosed in U.S. Pat. Nos. 4,409,444 (arc shields surrounding the contact and arc runways that adjoin the contact) and 3,402,273 (arc chambers which closely surround cooperating contacts of a circuit breaker to hasten extinguishment). Such means, however, attempt to control the arc only after it is formed.

U.S. Pat. No. 3,636,292 discloses a vacuum switch comprising two pairs of operating contacts arranged in a vacuum chamber and operable by a drive means. A semiconductor diode, mounted in the vacuum chamber, bridges one of the two pairs of operating contacts. Interruption of the alternating current circuit opens the pair of operating contacts bridged by the diode prior to opening of the other pair of operating contacts. An elaborate contact drive means comprises a control means that actuates the contacts only when the alternating voltage at the diode is poled for forward direction. As a result of the use of the diode, interruption in the flow of alternating current occurs with formation of a nominal arc, and contact temperature and evaporation are reduced. However, the switch disclosed in the patent is limited for use in a vacuum chamber.

Various semiconductor switches are also known. For example, U.S. Pat. No. 4,365,170 discloses a semiconductor switch comprising a PNPN switch having a semiconductor PNPN structure with at least three PN junctions. Other examples include U.S. Pat. Nos. 4,380,021, 3,784,886 and 3,427,512. However, such semiconductor switches are not employed in switchgear of the type discussed above, wherein arc erosion of contacts is a common problem.

Further, it is well-known that semiconduction devices when used in electrical circuits allow leakage of currents between the supply and load (source/drain).

Accordingly, the present invention provides an electromechanical switch which evidences minimal contact erosion due to arcing. The present invention provides an electrical contact capable of making and breaking electrical contact without substantial erosion of the contact surface and, additionally, provides an electrical contact in which current is permitted to flow only when the contact gap has been completely closed and in which current is interrupted prior to opening the contacts. Furthermore, the present invention minimizes $I^2 R$ losses of the contact.

SUMMARY OF THE INVENTION

In accordance with the invention, an improved electrical switch for current interruption is provided. In one embodiment, the electrical switch comprises a stationary contact and a separable moving contact, movable in a predetermined plane of motion in and out of engagement with the stationary contact to interrupt the flow of current therethrough.

The improvement comprises a semiconductor switching assembly formed on a contact surface. For interrupting DC current, the semiconductor switching assembly is of the appropriate polarity to match the polarity of the DC current being interrupted. For interrupting AC current, a bi-directional semiconductor switching assembly is employed. In either case, the semiconductor switching assembly includes a gate electrode for control.

Any state of the art semiconductive architecture presently used for switching applications may be incorporated into the invention. Such architecture is well-known to those skilled in the art, and includes such devices as CMOS (complementary metal-oxide semiconductor—a device formed by the combination of PMOS and NMOS elements or channels), FET (field effect transistor), MTNS (metal thick nitride semiconductor) and MTOS (metal thick oxide semiconductor). The selection of the architecture employed is dependent upon the application for which the invention will be used with respect to circuit conditions, i.e., AC/DC, high voltage/low voltage, high current/low current.

In operation, the semiconductor switching assembly is turned OFF prior to separation of the contacts, thus interrupting the current, and is turned ON subsequent to the engagement of the contacts, thus permitting the current to flow. Turning of the semiconductor switching assembly ON or OFF (and thereby switching the current on or off) is achieved by applying voltage to or removing voltage from the gate electrode, respectively.

By interruption of the current in this manner, arcs cannot occur during the making or breaking of contact. Thus, erosion of the contact surfaces is substantially reduced and occurs, if at all, simply through the mechanical action of making and breaking of contact. Accordingly, the lifetime of the electrical switch is considerably prolonged. Further, $I^2 R$ losses are minimized by providing a high electrical conductivity material on the contact surfaces.

BRIEF DESCRIPTION OF THE DRAWING

FIG. 4b is a timing chart for the control circuit of FIG. 4a;

FIG. 5b is the symbol for the device depicted in FIG. 5a;

FIG. 6b is the symbol for the device depicted in FIG. 6a;

FIG. 7b is the symbol for the device depicted in FIG. 7a.

DETAILED DESCRIPTION OF THE INVENTION

It is known that contact materials of different composition evidence arc erosion changes according to the type of composition from which the material is fabricated. However, it is also known that all conventional contacts produce arcing. This arching is found to be attributed to a number of factors: (1) bouncing of the contacts when they first make a circuit, and (2) the inductance or energy stored by the load of the circuit. Arcing, and thus erosion, is therefore inevitable unless the current can be blocked or stopped before the contacts are closed or opened or when a sinusoidal current (AC) is used, the device is switched at or near the time the current is at zero potential during crossover to the negative half cycle. However, operating a conventional electromechanical device at precisely the same period each time is very difficult. This is due to the random idiosyncrasy of the device, such as collapsing of the magnetic field supplied by the coil.

Figure 1:
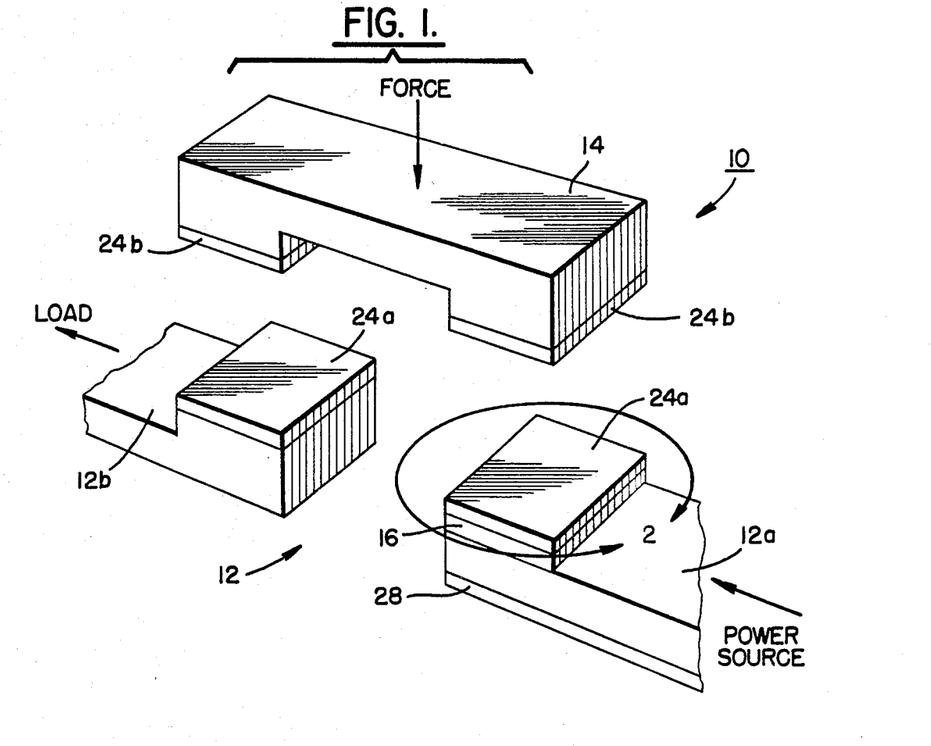
FIG. 1 is a three-dimensional view of an electrical switch employing a semiconductor switching assembly in accordance with the invention.
Figure 2:
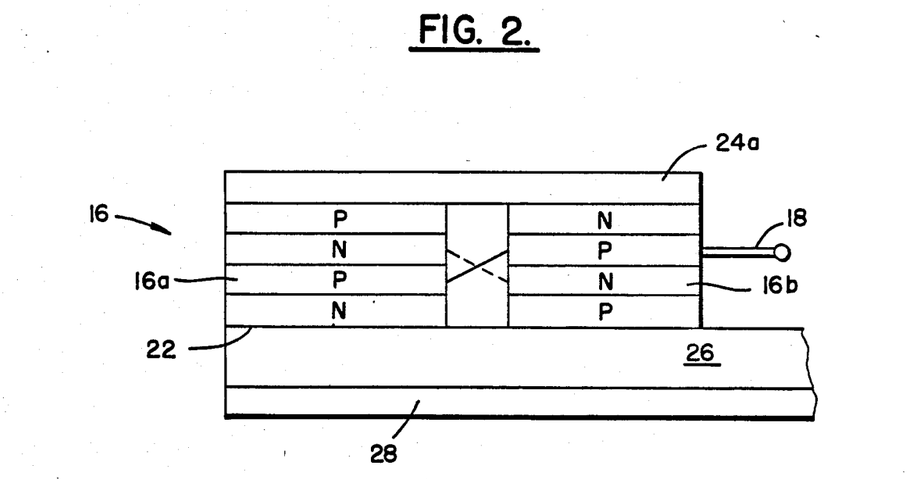
FIG. 2 is an enlarged view of a portion of FIG. 1, showing one embodiment of the invention, which depicts a bi-directional semiconductor switching assembly for AC applications.

With reference to FIGS. 1 and 2, there is shown an electrical switch 10 comprising a stationary contact 12 and a separable moving contact 14. As is well-known for switches of this type, the moving contact 14 is movable by means of some force (not shown) in a predetermined plane of motion in and out of engagement with the stationary contact 12 so as to interrupt the flow of current therethrough. The stationary contact 12 comprises two portions; one portion 12a is electrically connected to a power source, or supply (not shown), which may be AC or DC, while a second portion 12b is connected to a load (not shown).

In accordance with the invention, one of the contacts is provided with a semiconductor switching assembly 16 which has a gate electrode 18 for controlling electrical flow through the assembly. The semiconductor switching assembly 16 may comprise any of the commonly known gate-controlled switching devices, such as a PNPN switch. For DC applications, it is only necessary that a device of the proper polarity be used. For AC applications, two such devices, mounted in an anti-parallel arrangement (bi-directional), are suitably employed. Preferably, the stationary contact 12, and most preferably, the contact portion 12a on the power supply side, is provided with the semiconductor switching assembly 16.

Figure 3:
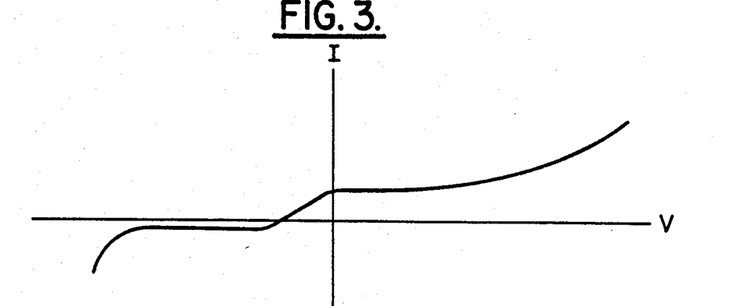
FIG. 3 is a graph showing a voltage-current characteristic of the half-wave conduction of a sinusoidal current through one element of the bi-directional semiconductor switching assembly of FIG. 2.

One embodiment, for use in AC applications, is depicted in FIGS. 2 and 3, wherein the semiconductor switching assembly 16 comprises two four-layer elements, 16a and 16b. Each element enables a half-wave of sinusoidal current to pass through it when required. By the application of a control current to an electrode 18 that protrudes from the semiconductor switching assembly 16, conduction of current through the electrical switch 10 is controlled.

The two elements 16a, 16b of the semiconductor switching assembly 16 are mounted in opposition to each other and consist of four layers of single crystalline silicon, each of which have been doped with a suitable Group III or Group V element to form a P-type or an N-type layer, respectively, although other semiconductor materials (e.g., gallium arsenide), appropriately doped, may also be employed. The amount of dopant is dependent upon the operational characteristics of the contact with respect to the current and voltage of the circuit in which the contacts will operate. The two elements 16a, 16b are identical in construction and comprise alternating layers of P- and N-type material.

The two elements are mounted side by side in opposite directions (i.e., P-N-P-N and N-P-N-P) and are electrically isolated from each other, except as described below. A control electrode 18 which is common to both elements is then attached to one layer of each of the individual elements; conveniently, this is the inner P layer of each element. Alternately, the inner N layers may be so interconnected. Of course, the design of the triggering method that is used would determine whether positive or negative were utilized. Advantageously, commercially available semiconductor devices are available for such contacts which have positive gating.

The complete assembly is then protected by a heat conductive epoxy (not shown) to aid in the removal of heat generated during operation of the semiconductor switching assembly. Three electrodes are then exposed on the semiconductor switching assembly: contact surface interface 249, contact backing interface 22 and the control electrode 18.

Either the top or bottom of the semiconductor switching assembly may be chosen for the face that will represent the electrical interface with other conventional contacts. The chosen face is covered with a highly conducting material 24, such as a silver metal or alloy, which enhances the electrical contact between the semiconductor switching assembly 16 and its associated contact 12a and the moving contact 14 and thus minimizes the $I^2 R$ losses. The contact surfaces of the stationary contact portion 12b and that portion of the moving contact 14 in mating contact therewith may also be so covered.

The opposite end 22 of the semiconductor switching assembly 16 is attached to a conductive substrate 26, such as a copper blade, which not only provides a rigid platform for the semiconductor switching assembly but also provides heat sinking to remove heat, which is generated in a semiconductor junction device by two predominant effects. The first is by penetration of the gate layer or junction. During this phenomenon, when the semiconductor device is triggered (injected with charge carriers), only a small cross-section of the gate junction layer allows the current to flow through it. This restriction can cause hot spots to be created, which must be quickly dissipated to avoid damage. The second phenomenon is associated with charge mobility and the mean free path of electrons. In this case, charges that pass through the junction continue to travel into the opposing structure until they encounter other electrons or holes, as the case may be, whereupon they drop to a lower level of energy and in doing so, generate excess energy in the form of heat or thermal energy.

Both of the above phenomena contribute to an increase in temperature at the junction of the semiconductive structure and, if such temperatures are not controlled by thermal management, degradation of the conductivity within the structure can take place or catastrophic thermal runaway may develop.

For this reason, the semiconductive elements of the invention are preferably mounted onto the fixed electrode (e.g., stationary contact 12) of the electro-magnetic device and thereby allow some portion of the heat to be conducted through the interconnecting copper electrical conductors. The moving contacts, because of their isolation, offer little if any contribution to thermal management. Because the junction temperature is difficult to measure by simple conventional methods, it is usual to measure the outer edge of the semiconductive structure. "Case" thermal management is used to maintain this temperature within the limits acceptable to the particular material used in the construction of the semiconductive contact structure.

Additional heat sinking may be provided by a material 28 that is interfaced with the contact structure. Materials that have acceptable insulation properties may be used to transport heat and also provide electrical insulation from the electrical source of power. One such material suitable for this application is beryllium oxide (BeO). Other materials which have small atomic radii, such as oxides of low atomic number elements, may also be employed in the practice of the invention.

In the forward direction (i.e., + to −), the characteristics of each element of the semiconductor switching assembly 16 is shown in FIG. 3 with respect to voltage and current. The half-wave conduction of a sinusoidal current through one element of the controlled bi-directional semiconductor switching assembly 16 is illustrated. Each element 16a, 16b behaves like that of the two combined series p-n (diode) junctions. The characteristics of the conduction in both the forward and reverse direction are the same up to the point where a control current is required. At this point, multiple conduction begins and the sum of the current carriers by the element increases at a rapid rate until the element (e.g., 16a) of the contact becomes highly conductive (hard ON). The element remains in the highly conductive state until the positive sinewave of the current has fallen below a fixed point which is determined by the application of the contact. When the current falls below this value, the element reverts to its nonconductive state and blocks the current. After the current changes direction at the zero point, the element remains in the blocking condition due to its diode characteristics. However, the second element (e.g., 16b), which is configured in the opposite direction to that of the first element, goes into conduction in a similar manner to that of the first element, only this time allowing the negative portion of the sinusoidal current to pass into the load circuit. The seesaw operation continues for each half cycle of the current, alternating from element 16a to element 16b, providing sufficient current is applied to the control electrode 18.

Upon removal of the control current, both of the semiconductor switching elements 16a, 16b revert to their current blocking states and thus prevent any significant current from passing into the load circuit.

By timing of the control current that is applied to the control electrode 18, the current can be blocked from passing through the contact 10 when required. Conveniently, any timing circuit, such as a simple resistance and capacitance timing circuit, may be employed to block the current until the contact 14 is closed and sealed with its mating conventional contact 12. The control current is then applied, allowing the contact to go from blocking condition into its highly conductive condition. Conversely, a few milliseconds (>8.4) before the contacts begin to open, the control current is removed, again conveniently employing the timing circuit, first causing the semiconductor switching assembly to block the current, after which the contacts 12, 14 are allowed to separate.

Figure 4A:
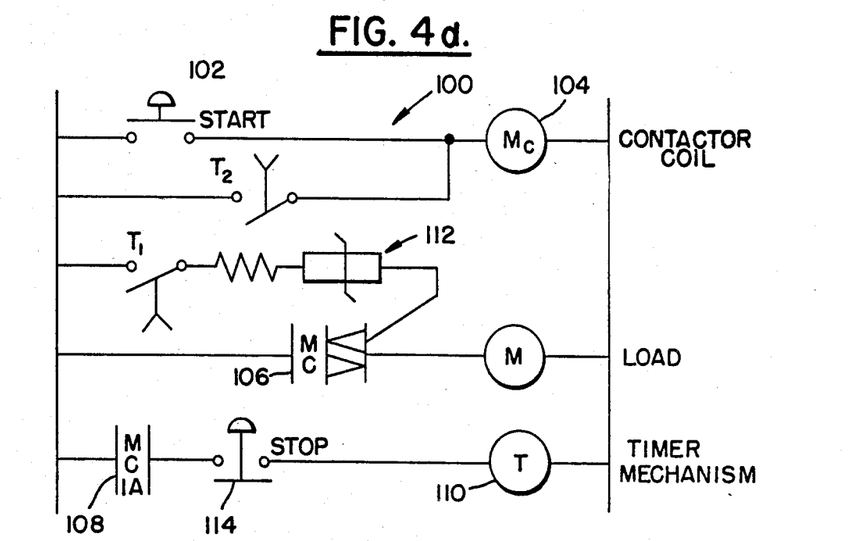
FIG. 4a is a control circuit for use in controlling the operation of the bi-directional semiconductor switch depicted in FIG. 2.

A simple conventional control circuit 100 is depicted in FIG. 49. The contact making sequence commences with the pressing of the start button 102. The coil 104 operates and closes contacts 106 and 108. The closing of contact 108 starts timer mechanism 110, which delays triggering the contact 106 until it is fully closed and sealed. Switch $T_2$ closes after a short delay and seals coil 104, after which switch $T_1$ closes and triggers contact 106 into conduction. The contact opening sequence commences with the pressing of the stop button 114. The timer mechanism 110 operates switch $T_1$, which instantly turns off the trigger source. Switch $T_2$ remains closed for the required delay before opening to deenergize the coil 104 and allow the contacts 106 to open. The timer mechanism 110 may be electronic, electro-mechanical, optical or pneumatic. If it is electronic, switches $T_1$ and $T_2$ are solid state.

Typical times for AC motor starters are:

|  | Time $T_1$ close, millisec | Time $T_1$ open, microsec | Time $T_2$ close, millsec | Time $T_2$ open, millisec |
| --- | --- | --- | --- | --- |
| Size 0–2 | 3 | 0.05 | 0.5 | 8.4 |
| Size 3–4 | 6 | 0.1 | 0.65 | 8.9 |
| Size 5–6 | 11 | 0.15 | 0.72 | 9.1 |

Figure 4B:
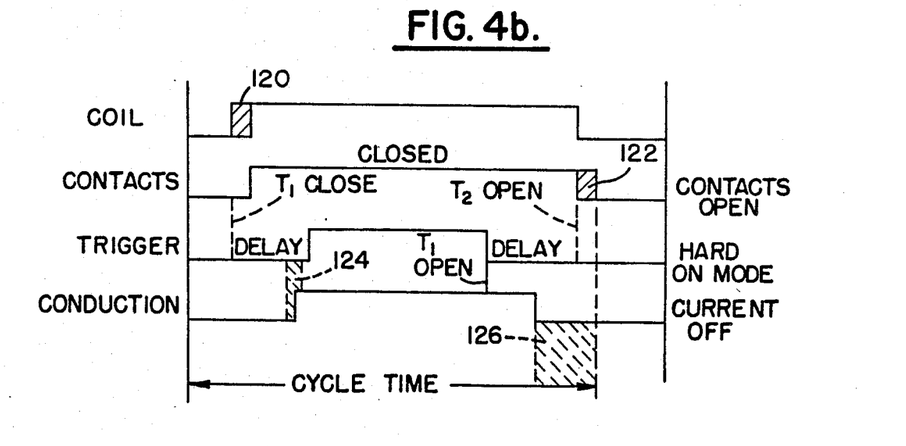

The timing chart for the AC switch control circuit of FIG. 4a is depicted in FIG. 4b. In FIG. 4b, the area denoted 120 represents the pull up time (the time for the armature to move and the coil to saturate). The area denoted 122 represents the drop out time (the time for the coil field to collapse and the armature to drop out of position). The area denoted 124 represents the semiconductor turn ON time, while the area denoted 126 represents the semiconductor turn OFF time. The delay time between $T_1$ open and $T_2$ open is at least 8.4 msec.

The significance of 8.4 msec is the time to complete one half of a cycle of a 60 Hz power supply. If the trigger electrode voltage/current is removed at a point which is the commencement of a half cycle, then current will continue to flow through the circuit for a time that is slightly less than 8.33 msec, i.e., the point where the voltage has dropped to a level where the current will cease to flow. Therefore, 8.4 msec is the minimum delay (at 60 Hz; other AC frequencies will require a different time delay) that will ensure the voltage has reached a level below the break-over voltage.

Clearly, the trigger source may be removed at any time which is random in respect to the wave form, hence, the actual time for the supply voltage to reach a point which is just greater than zero crossover may be any portion of the maximum 8.4 msec.

The times specified are applicable to the standard US power frequency. For operation in higher or lower frequency, the delay time after the trigger source is removed, until the contacts are allowed to open, may be adjusted to suit the application. For DC applications, the timing of the delay characteristics will be, of course, completely different, being dependent only upon blocking the voltage before the contacts open and permitting the voltage to flow after making contact.

The semiconductor switch for AC applications discussed above comprises two elements of four layers each, mounted in anti-parallel arrangement. In an alternative embodiment, the structure of the semiconductive contact may comprise a single five layer structure which may or may not incorporate junction technology. Such technology known by those skilled in the art as MOS may be used in the fabrication of the invention whereupon devices used for protection of the solid state contact may be embodied into the structure, thus permitting the solid state contact to be configured in what is commonly called an integrated circuit (IC).

Figures 5A, 6A:
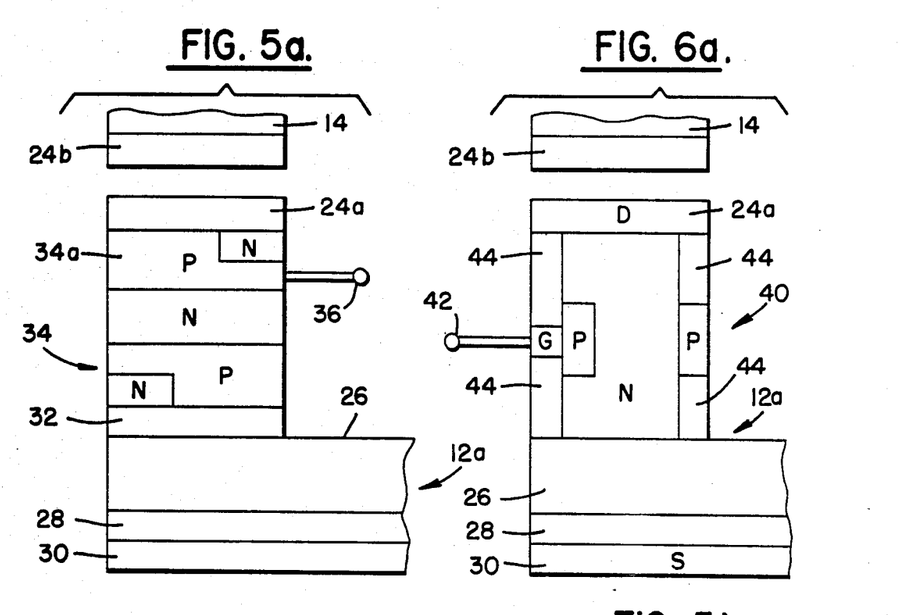
FIG. 5a is an alternative semiconductor switch for AC applications, comprising five semiconductor layers.
FIG. 6a is an embodiment of the invention depicting a JFET switch for DC applications.
Figure 5B:
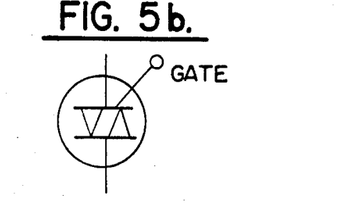

An example of such a five layer configuration is shown in FIG. 5a. As with the four layer configuration, the moving contact 14 has a highly conducting layer 24b formed on its contact surface. The stationary contact 12a has formed thereon a five layer structure 34 comprising alternating P and N layers. A gate contact 36 is made to one of the layers, here, 34a, for controlling the voltage flowing through the device. The five layer structure 34 is separated from the contact 12a by a highly conducting layer 32, such as silver. Heat sinking is provided by layer 28, comprising a material such as beryllium oxide. Additional heat sinking may be provided by an additional layer 30, such as aluminum. Layers 30 and 32 may be also employed in the four layer device depicted in FIGS. 2 and 3. FIG. 5b represents the electronic symbol for the diagrammatic construction illustrated in FIG. 5a.

When the invention is used in an AC circuit, the configurations may comprise four or five layers, as described above, the former representing one half cycle conduction, or 180° (and thereby requiring two elements mounted in anti-parallel arrangement), and the latter representing one full cycle conduction, or 360°.

The trigger current to the gate is only required for a short period of time: once the device goes into the conduction mode, it remains in this state until the break-over voltage ($V_{BO}$) drops to a state where conduction cannot be sustained and thus reverts to a blocking mode.

Injection of a gate current may be termed as a method of inducing the required break-over voltage that transforms the contact into a highly conductive mode. The trigger voltage may be determined as a function of the trigger current $I_g$. If the value of $I_g$ is large (hard ON), then the behavior of the semiconductive structure approximates that of the well-known p-n diode during the appropriate cycle of conduction. For applications requiring a full cycle of conduction (i.e., the five layer contact system), the trigger or gate current is applied in synchronism with the applied voltage. However, by alteration of the controlling gate current with respect to the angle $\phi$ of the supply voltage, the angle $\theta$ on the sinewave at which conduction takes place can be varied from 0° to 180° for each half cycle. Thus, the current supplied to the load is directly proportional to the portion of voltage applied.

For applications where control of the current is not required, the semiconductive contact is allowed to conduct for the full 180° per half cycle, completing the full cycle commutation of 360° between the negative and positive cycle of the supply. This type of application requires a five layer structure which provides for commutation of both the positive half cycle and the negative half cycle alternately. Thus, the current is directly proportional to that of the supply voltage. The semiconductive contact conducts in the same mode as that of a conventional contact, the only difference being that the current is blocked until such time that the contact gap is fully closed and sealed. After that time, the semiconductive contacts become fully conductive, i.e., for 360°. During the circuit interruption process, the gate current is removed and a short delay is required to allow the supply voltage to fall below the break-over voltage and thus revert to the current blocking mode at which time the contacts may be separated, isolating the supply from the load.

The critical control parameters of the trigger control electrodes are variable, depending on several factors, one of which is the architecture of the semiconductive contact, i.e., FET junction, planar, etc., and the application for which the invention will be used, i.e., DC, AC, high current, high voltage, etc. For example, comparing power transistors, FETs and power junction devices: The latter is designed so that the base layers are thick in order to withstand high voltage forces and also to possess low forward current transfer ratio. The current carried by this type of architecture may be larger because the junction area may be designed large enough to accomplish high current densities. Some of the parameters for this type of device are voltage ratings of $>1500$ V at currents of about 600 A avg. RMS. Typical gate trigger currents about 50 mA at a voltage which ranges between 1 to 2 V will control a semiconductive contact that will pass $>100$ A of current. The typical time for turning the structure into conduction is about 1 microsec. The average power required by the trigger gate is very small. On the other hand, the time required to turn OFF (block) the semiconductive contact, during which time the circuit voltage is kept below the break-over voltage, is considerably longer than that of the turn ON time, as shown above.

When switching DC currents using FET architecture, the trigger electrode parameters will, of course, be considerably different. Typical examples are 0.1 to 12 V. Gate voltage currents are negligible. For depletion-type FET, these values may be placed in the negative mode, i.e., $-0.1$ to $-12$ V. As will be the current carrying ability of a single device architecture, however, higher currents may be carried by implanting parallel structures into an integrated circuit.

Figure 6B:
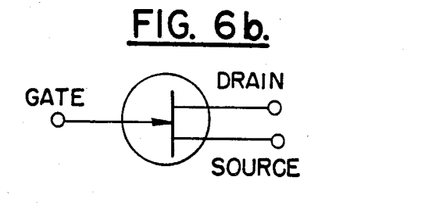
Figure 7A:
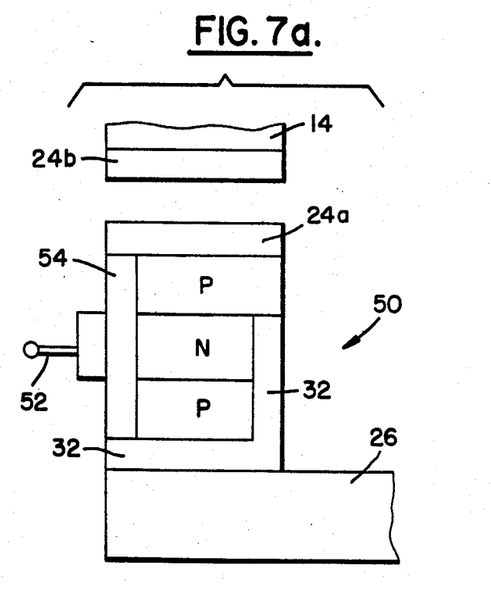
FIG. 7a is an embodiment of the invention depicting an example of a MOSFET switch for DC applications.
Figure 7B:
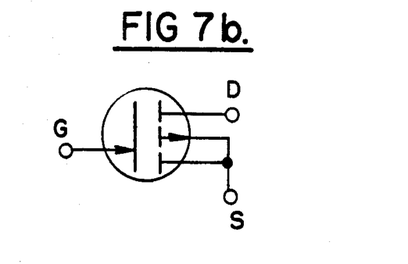

Examples of semiconducting elements for various DC applications are depicted in FIGS. 6 and 7. As with all DC elements, the source is the interface of the circuit where charge carriers enter the element. For most applications, the source is interconnected with the substrate. The drain is the interface at which current leaves the element. The gate is the third electrode which controls the conductance of the current passing between the source and drain.

FIG. 6a depicts a depletion mode JFET, useful for low to moderate voltages. In FIG. 6a, the source is the substrate 26, the drain is the highly conducting layer 24a and the gate electrode is denoted 42. Oxide insulation 44, typically silicon dioxide, is provided. The current from the source 26 for a given voltage $V_{DS}$ is dependent on the dimensions of the channel 40a when the p-n junction is reversed biased. By application of a voltage to the gate $V_{GS}$, a depletion zone is formed which contains no mobile carriers, thus the width of the conducting area is reduced. The gate junction with the other elements forms a conventional p-n junction. However, the resistance of the input gate becomes quite high because of the reverse bias.

FIG. 6b is a typical electronic symbol for the diagrammatic construction illustrated in FIG. 6a.

FIG. 7a depicts one example of a DC MOSFET switch 50, with gate electrode 52. Oxide insulation 54 is provided as shown. The highly conducting layer 32 is in contact with both a P layer and an N layer. Other configurations are also possible for specific applications. FIG. 7b represents the electronic symbol for the diagrammatic construction shown in FIG. 7a.

EXAMPLES

Example 1

A comparison was made of erosion modes between a conventional pair of contacts and a pair of contacts comprising a solid state contact and a conventional contact, in accordance with the invention. The tests were performed in accordance with IEC publication 158-1, employing single phase conditions.

Each pair of contacts was subjected to identical circuit conditions: IEC AC/4 for a NEMA size 1 motor starter. The voltage was 115 V RMS at a current six times the normal horsepower rating of the device, which was ½ hp=9.8 A, or full load times 6=58.8 A. The duty cycle of both devices was set to perform 300 operations per hour. Each device was subjected to the load in turn for a period of one second.

Before starting the test, each contact assembly was carefully weighed. Both pairs of contacts were operated for 100,000 operations and then stopped; comparison between the two contact sets was then made. The two sets of contacts were reweighed.

The conventional contacts were found to have suffered an erosion loss of 1.284 g, while the semiconductive contact and the mated conventional contact evidenced a weight loss of only 0.031 g.

EXAMPLE 2

In a second test, operated at three phase at 575 V into a 1 hp motor AC/3, the current at contact make was six times the normal, while the current at contact break was normal. Visual inspection after 100,000 operations showed very little erosion had taken place on the contact surface. In contrast, a conventional contact operated under the same conditions showed considerable erosion and distortion of the contact surface.

The foregoing description has dealt with only a few of the many possible configurations. Thus, the invention may be employed in other configurations as well. For example, the inventive approach may be utilized in a three pole electrical contactor which uses a double air gap, i.e., a movable bridging assembly, or a single air gap, depending upon the criteria of the electromechanical designer.

These types of devices are suitable for operation in a three-phase asynchronous circuit. However, only one solid state contact is employed in each pole of the electromechanical device. It will be recognized by those skilled in the art that any configuration of electromechanical, hydraulic or mechanical device that presently contains conventional contact material which is used to make and break an electrical circuit may utilize the invention. It will also be recognized by those so skilled that any "solid state" configuration which is presently used as a stand alone switching device may be incorporated into the invention. However, the selection of the architecture and manufacturing technologies, which are well-known, will be dependent on the application for which the invention will be utilized, notwithstanding the characteristics of the circuit to be interrupted, i.e., AC or DC, high current or low voltage, high voltage or medium current, inductive, capacitive or resistive. Also, the duty cycle of the electromechanical device will contribute to the technology and architecture used in constructing the invention.

Further, the invention is not limited to one base or secondary semiconductive element in its construction. However, silicon being well-known to those so skilled for its ability to pass substantial power is presently the primary choice over others. In addition to gallium arsenide and other materials disclosed above, a material such as silicon carbide, which may be resolidified onto a (100) silicon single crystal substrate by use of well-known technologies such as chemical vapor deposition, may be used in applications where substantial currents are required and whereupon heat dissipation is of prime concern for the efficient operation of the invention.

It is to be understood that the above described embodiment of the invention is illustrative only, and that modifications thereof may occur to those skilled in the art. Accordingly, this invention is not to be regarded as limited to the embodiment as disclosed herein, but is to be limited only as defined by the appended claims.

What is claimed is:

1. An improved electrical switch for current interruption comprising a stationary contact and a separable moving contact movable in a predetermined plane of motion in and out of engagement with said stationary contact to interrupt the flow of current therethrough, the improvement comprising a semiconductor switching assembly on a contact surface of said electrical switch, said semiconductor switching assembly having a gate electrode for controlling electrical flow therethrough.

2. The electrical switch of claim 1 in which said semiconductor switching assembly is formed on the contact surface of said stationary contact.

3. An improved electrical switch for alternating current interruption comprising a stationary contact and a separable moving contact movable in a predetermined plane of motion in and out of engagement with said stationary contact to interrupt the flow of current therethrough, the improved switch comprising a multi-element semiconductor switching assembly on a contact surface of said electrical switch, said assembly having a gate electrode for controlling electrical flow therethrough.

4. The electrical switch of claim 3 in which said semiconductor switching assembly is formed on the contact surface of said stationary contact.

5. The electrical switch of claim 3 in which said multi-element semiconductor switching assembly comprises two sub-assemblies of four elements each, each sub-assembly comprising alternating P-type and N-type elements and mounted in anti-parallel configuration on said contact surface.

6. The electrical switch of claim 5 in which said semiconductor switching assembly comprises a pair of anti-parallel PNPN switches on said contact surface of said stationary contact, one side of which pair is connected to said contact surface to bridge the outermost P layer of one PNPN switch with the outermost N layer of the other PNPN switch, and the other side of which pair is provided with a high electrically conducting layer bridging the outermost N layer of said one PNPN switch with the outermost P layer of said other PNPN switch, with the internal P layers of the two switches interconnected and a predetermined voltage impressed thereon as necessary to reduce contact erosion during the making and breaking of contact.

7. The electrical switch of claim 3 in which a voltage is applied to said gate electrode to turn on said switch assembly, said voltage being applied at least about 8.4 milliseconds after the contacts have closed in a circuit operating at 60 Hz.

8. The electrical switch of claim 3 in which a previously-applied voltage is removed from said gate electrode to turn off said switch assembly, said voltage being removed at least about 8.4 milliseconds before the contacts are to open in a circuit operating at 60 Hz.

9. An improved electrical switch for direct current interruption comprising a stationary contact and a separable moving contact movable in a predetermined plane of motion in and out of engagement with said stationary contact to interrupt the flow of current therethrough, the improved switch comprising a multi-element semiconductor switching assembly comprising at least three elements formed on a contact surface of said electrical switch, said assembly having a gate electrode for controlling electrical flow therethrough.

10. The electrical switch of claim 9 in which said semiconductor switching assembly is formed on the contact surface of said stationary contact.

11. The electrical switch of claim 9 in which said semiconductor switching assembly includes a source region, a drain region and a gate electrode.

12. A method for interrupting current flow in an electrical switch comprising a stationary contact and a separable moving contact movable in a predetermined plane of motion in and out of engagement with said stationary contact, said method comprising providing a semiconductor switching assembly on a contact surface of said electrical switch, said assembly having a gate electrode capable of being switched on and off so as to permit the flow of current therethrough and to interrupt current, respectively.

13. The method of claim 12 in which said semiconductor switching assembly is mounted on the contact surface of said stationary contact.

14. The method of claim 12 in which said semiconductor switching assembly comprises a plurality of elements, said assembly having a gate electrode for controlling electrical flow therethrough.

15. The method of claim 14 in which said semiconductor switching assembly comprises at least four elements for AC applications.

16. The method of claim 15 in which said semiconductor switching assembly comprises two sub-assemblies of four elements each, each sub-assembly comprising alternating P-type and N-type elements and mounted in anti-parallel configuration on said contact surface.

17. The method of claim 16 in which said semiconductor switching assembly comprises a pair of anti-parallel PNPN switches on said contact surface of said stationary contact, one side of which pair is connected to said contact surface to bridge the outermost P layer of one PNPN switch with the outermost layer of the other PNPN switch, and the other side of which pair is provided with a high electrically conducting layer bridging the outermost N layer of said one PNPN switch with the outermost P layer of said other PNPN switch, with the internal P layers of the two switches interconnected to form said gate electrode.

18. The method of claim 17 including applying voltage to and removing voltage from the internal P layers of a value sufficient to permit current flow through said electrical switch to be initiated or interrupted, respectively.

19. The method of claim 15 in which a voltage is applied to said gate electrode to turn on said switch assembly, said voltage being applied at least about 8.4 milliseconds after the contacts have closed in a circuit operating at 60 Hz.

20. The method of claim 15 in which a previously-applied voltage is removed from said gate electrode to turn off said switch assembly, said voltage being removed at least about 8.4 milliseconds before the contacts are to open in a circuit operating at 60 Hz.

21. The method of claim 14 in which said improved switch comprises a multi-element semiconductor switching assembly comprising at least three elements formed on a contact surface of said electrical switch, said assembly having a gate electrode for controlling electrical flow therethrough for DC applications.

22. The method of claim 21 in which said semiconductor switching assembly includes a source region, a drain region and a gate electrode.

23. An improved electrical switch for current interruption comprising a pair of mating separable contacts mutually movable in a predetermined plane of motion in and out of engagement with one another to interrupt the flow of current therethrough, the improvement comprising a semiconductor switching assembly on a contact surface of said electrical switch, said semiconductor switching assembly having a gate electrode for controlling electrical flow therethrough.

24. An improved electrical switch for alternating current interruption comprising a pair of separable mating contacts mutually movable in a predetermined plane of motion in and out of engagement with one another to interrupt the flow of current therethrough, the improved switch comprising a multi-element semiconductor switching assembly on a contact surface of said electrical switch, said assembly having a gate electrode for controlling electrical flow therethrough.

25. The electrical switch of claim 24 in which said multi-element semiconductor switching assembly comprises two sub-assemblies of four elements each, each sub-assembly comprising aalternating P-type and N-type elements and mounted in anti - parallel configuration on said contact surface.

26. The electrical switch of claim 25 in which said semiconductor switching assembly comprises a pair of anti-parallel PNPN switches on said contact surface, one side of which pair is connected to said contact surface to bridge the outermost P layer of one PNPN switch with the outermost N layer of the other PNPN switch, and the other side of which pair is provided with a high electrically conducting layer bridging the outermost N layer of said one PNPN switch with the outermost P layer of said other PNPN switch, with the internal P layers of the two switches interconnected and a predetermined voltage impressed thereon as necessary to reduce contact erosion during the making and breaking of contact.

27. The electrical switch of claim 24 in which a voltage is applied to said gate electrode to turn on said switch assembly, said voltage being applied at least about 8.4 milliseconds after the contacts have closed in a circuit operating at 60 Hz.

28. The electrical switch of claim 24 in which a previously-applied voltage is removed from said gate electrode to turn off said switch assembly, said voltage being removed at least about 8.4 milliseconds before the contacts are to open in a circuit operating at 60 Hz.

29. An improved electrical switch for direct current interruption comprising a pair of separable contacts mutally movable in a predetermined plane of motion in and out of engagement with one another to interrupt the flow of current therethough, the improved switch comprising a multi-element semiconductor switching assembly comprising at least three elements formed on a contact surface of said electrical switch, said assembly having a gate electrode for controlling electrical flow therethrough.

30. The electrical switch of claim 29 in which said semiconductor switching assembly includes a source region, a drain region and a gate electrode.

31. A method of interrupting current flow in an electrical switch comprising a pair of separable contacts mutually movable in a predetermined plane of motion in and out of engagement with one another, said method comprising providing a semiconductor switching assembly on a contact surface of said electrical switch, said assembly having a gate electrode capable of being switch on and off so as to permit the flow of current therethrough and to interrupt current, respectively.

32. The method of claim 31 in which said semiconductor switching assembly comprises a plurality of elements, said assembly having a gate electrode for controlling electrical flow therethrough.

33. The method of claim 32 in which said semiconductor switching assembly comprises at least four elements for AC applications.

34. The method of claim 33 in which said semiconductor switching assembly comprises two sub-assemblies of four elements each, each sub-assembly comprising alternating P-type and N-type elements and mounted in anti-parallel configuration on said contact surface.

35. The method of claim 34 in which said semiconductor switching assembly comprises a pair of anti-parallel PNPN switches on said contact surface, one side of which pair is connected to said contact surface to bridge the outermost P layer of one PNPN switch with the outermost layer of the other PNPN switch, and the other side of which pair is provided with a high electrically conducting layer bridging the outermost N layer of said one PNPN switch with the outermost P layer of said other PNPN switch, with the internal P layers of the two switches interconnected to form said gate electrode.

36. The method of claim 35 including applying voltage to and removing voltage from the internal P layers of a value sufficient to permit current flow through said electrical switch to be initiated or interrupted, respectively.

37. The method of claim 33 in which a voltage is applied to said gate electrode to turn on said switch assembly, said voltage being applied at least about 8.4 milliseconds after the contacts have closed in a circuit operating at 60 Hz.

38. The method of claim 33 in which a previously-applied voltage is removed from said gate electrode to turn off said switch assembly, said voltage being removed at least about 8.4 milliseconds before the contacts are to open in a circuit operating at 60 Hz.

39. The method of claim 32 in which said improved switch comprises a multi-element semiconductor switching assembly comprising at least three elements formed on a contact surface of said electrical switch, said assembly having a gate electrode for controlling electrical flow therethrough for DC applications.

40. The method of claim 39 in which said semiconductor switching assembly includes a source region, a drain region and a gate electrode.

* * * * *